US009721637B2

(12) United States Patent
Houssameddine (10) Patent No.: US 9,721,637 B2
(45) Date of Patent: *Aug. 1, 2017

(54) METHOD OF WRITING TO A SPIN TORQUE MAGNETIC RANDOM ACCESS MEMORY

(71) Applicant: Everspin Technologies, Inc., Chandler, AZ (US)

(72) Inventor: Dimitri Houssameddine, Gilbert, AZ (US)

(73) Assignee: EVERSPIN TECHNOLOGIES, INC., Chandler, AZ (US)

(*) Notice: Subject to any disclaimer, the term of this patent is extended or adjusted under 35 U.S.C. 154(b) by 3 days.

This patent is subject to a terminal disclaimer.

(21) Appl. No.: 15/167,123

(22) Filed: May 27, 2016

(65) Prior Publication Data

US 2016/0276011 A1    Sep. 22, 2016

Related U.S. Application Data

(62) Division of application No. 13/631,395, filed on Sep. 28, 2012, now Pat. No. 9,378,792.

(60) Provisional application No. 61/576,215, filed on Dec. 15, 2011.

(51) Int. Cl.
G11C 11/00 (2006.01)
G11C 11/16 (2006.01)
G11C 13/00 (2006.01)

(52) U.S. Cl.
CPC ......... *G11C 11/1675* (2013.01); *G11C 11/16* (2013.01); *G11C 11/1673* (2013.01); *G11C 13/0002* (2013.01); *G11C 13/0097* (2013.01)

(58) Field of Classification Search
CPC ...... G11C 16/3459; G11C 16/08; G11C 16/10
See application file for complete search history.

(56) References Cited

U.S. PATENT DOCUMENTS

| 7,916,522 | B2 | 3/2011 | Itagaki et al. |
| 7,944,730 | B2 | 5/2011 | Chen |
| 8,054,675 | B2 | 11/2011 | Xi et al. |
| 8,059,450 | B2 | 11/2011 | Xi et al. |
| 8,867,266 | B2 | 10/2014 | Bessho et al. |
| 9,378,792 | B2 | 6/2016 | Houssameddine |
| 2006/0267056 | A1 | 11/2006 | Ju et al. |
| 2007/0030728 | A1 | 2/2007 | Kent et al. |
| 2007/0217253 | A1 | 9/2007 | Kim et al. |
| 2008/0043518 | A1 | 2/2008 | Schumacher |

(Continued)

OTHER PUBLICATIONS

The International Bureau of WIPO, International Preliminary Report on Patentability for International Application No. PCT/US2012/069725, mailed Jun. 26, 2014.

(Continued)

*Primary Examiner* — Pho M Luu
*Assistant Examiner* — Mohammed A Bashar
(74) *Attorney, Agent, or Firm* — Bookoff McAndrews, PLLC (57) ABSTRACT

A method for determining an optimized write pattern for low write error rate operation of a spin torque magnetic random access memory. The method provides a way to optimize the write error rate without affecting the memory speed. The method comprises one or more write pulses. The pulses may be independent in amplitude, duration and shape. Various exemplary embodiments adjust the write pattern based on the memory operating conditions, for example, operating temperature.

20 Claims, 4 Drawing Sheets

(56) References Cited

U.S. PATENT DOCUMENTS

| | | |
|---|---|---|
| 2008/0247222 A1 | 10/2008 | Jung et al. |
| 2010/0195380 A1 | 8/2010 | Wang et al. |
| 2010/0214825 A1 | 8/2010 | Chung et al. |
| 2011/0026322 A1 | 2/2011 | Ohmori et al. |
| 2012/0069633 A1 | 3/2012 | Katoh |

OTHER PUBLICATIONS

"Spin Transfer Torque (STT)-MRAM—Based Runtime Reconfiguration FPGA Circuit," Weisheng Zhao et al., IEF, Univ. Paris-Sud and CNRS and Pascale Mazoyer STMicroelectronics, ACM Transactions on Embedded Computing Systems, vol. 9, No. 2, Article 14, Publication date: Oct. 2009.

"Design Considerations and Strategies for High-reliable STT-MRAM," In: Microelectronics Reliability, vol. 51, Issues 9-11, Sep.-Nov. 2011, pp. 1454-1458.

PCT Search Report and Written Opinion mailed Feb. 22, 2013 in PCT/US12/69725.

METHOD OF WRITING TO A SPIN TORQUE MAGNETIC RANDOM ACCESS MEMORY

This application is a divisional of application Ser. No. 13/631,395 filed Sep. 28, 2012. Application Ser. No. 13/631,395 is incorporated by reference herein in its entirety. This application and application Ser. No. 13/631,395 claim the benefit of U.S. Provisional Application No. 61/576,215 filed Dec. 15, 2011.

TECHNICAL FIELD

The exemplary embodiments described herein generally relate to integrated magnetic devices and more particularly relate to programming methods for magnetoresistive memories.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element.

There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-transfer torque RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bit cell select devices in both current directions can limit the scalability of ST-MRAM. The write current is typically higher in one direction compared to the other, so the select device must be capable of passing the larger of the two currents. In addition, ST-MRAM switching current requirements increase as the write current pulse duration is reduced. Because of this, the smallest ST-MRAM bitcell approach may require relatively long switching times.

Data stored in memory is defined in banks. A rank is a plurality of banks in a first direction (column) and a channel is a plurality of banks in a second direction (row). A process for accessing the memory comprises several clock cycles required for row and column identification and a read or write operation. The bandwidth for the data transfer may comprise a row of many thousands of bits.

The conventional scheme for programming spin-torque MRAM is to apply a single current or voltage pulse to the memory cells to reverse the direction of their storage layer. The duration of the pulse is set by design requirements such as memory interface specifications. Generally, the write operation has to be completed in less than 50 ns. The write voltage amplitude is set to meet the memory write error rate (WER) and lifetime requirements. It has to be greater than a certain value Vw to assure that all bits are programmed reliably, with a write error rate below a defined value $WER_0$. For megabit memories, $WER_0$ is typically less than $10^{-8}$. The write voltage amplitude also has to be low enough to assure long-term device integrity. For magnetic tunnel junctions, elevated write voltage reduces the memory lifetime because of dielectric breakdown. In some cases, it is not possible to find a write voltage that meets the desired write error rate $WER_0$ and the required lifetime. Known solutions to improve the write error rate are adding one or several layers of error correction or using multiple write pulses.

Memory devices commonly include some form of error correcting code (ECC) in the output logic circuitry. If a memory bit is not set correctly during the write operation, the ECC may be used to correct the data during a subsequent access. However, if the WER is too high, ECC will not be able to efficiently handle all the failing bits.

The write error rate or switching distribution of magnetic bits as a function of the applied voltage can be well described by an error function. That is why a common approach to set the write voltage for an assembly of bits is to increase it until the write error rate reaches the desired value $WER_0$. Because of the stochastic nature of the magnetization reversal and the presence of defects in the memory elements, deviations from the ideal error function are commonly observed, resulting in an anomalously high write error rate and forcing the write voltage to be raised to meet $WER_0$.

Solutions based on write patterns composed of multiple pulses have been proposed to improve the overall memory write error rate in the presence of bits with anomalous switching distributions. However, such solutions significantly increase the write duration and negatively impact the memory speed performance.

Accordingly, it is desirable to provide a method of improving the write error rate of a memory array without impacting its performance, such as speed and endurance. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for writing to a spin-torque magnetoresistive random access memory.

A first exemplary embodiment is a method of determining a write pattern for writing to a plurality of bits in a spin-torque magnetoresistive memory array, the method comprising determining a write voltage in accordance with design requirements for the array; determining the number of write pulses required for a predetermined write time and for minimizing a write error rate for the number of bits, wherein the number of write pulses is at least one; and applying the determined number of write pulses to the array.

A second exemplary embodiment is a method of determining a write pattern for writing to a plurality of bits in a spin-torque magnetoresistive memory array, the method comprising setting a write voltage Vw to a minimum voltage Vmin; b) setting a number of write pulses i to one and a write pulse duration t to a maximum duration Tmax; c) defining a write pattern as a single pulse of duration t with an amplitude Vw; d) characterizing a write error rate (WER) for the write pattern; e) defining write pulse settings as Vw, i, t and d if WER is less than a desired write error rate $WER_0$; if WER is not less than $WER_0$, f) setting i to i+1; g) setting the pulse duration t to (Tmax−(i−1)d)/i; and h) defining the write pattern as i pulses of duration t spaced by distance d with amplitude Vw; i) returning to the step d if t is not less than a minimum duration Tmin; and j) if t is less than Tmin, increasing Vw if Vw is not greater than or equal to a maximum voltage Vmax and returning to step b.

A third exemplary embodiment is a system for determining a write pattern for writing to a spin-torque magnetoresistive memory array, the system comprising a processor configured to determine a write voltage in accordance with design requirements for the array; determine the number of write pulses required for a predetermined write time and for minimizing the WER for the number of bits, wherein the number of write pulses is at least one; and apply the determined number of write pulses to the array; and a plurality of bits in the array configured to receive the determined number of write pulses.

BRIEF DESCRIPTION OF THE DRAWINGS

The present invention will hereinafter be described in conjunction with the following drawing figures, wherein like numerals denote like elements, and:

FIG. 8 is a diagram of two write pulses having a reversed polarity pulse there between.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

The exemplary method described herein defines an optimized write pattern, in terms of memory speed and endurance, which meets a desired write error rate $WER_0$. In the case where the desired write error rate cannot be achieved by increasing the write voltage with a single pulse, breaking up the write pulse in multiple pulses of shorter duration provides a significant improvement of the write error rate. The duration of the write pattern is independent of the number of pulses it contains; therefore the memory speed is not affected. The multiple pulses may comprise different amplitudes, durations, and shapes. Various exemplary embodiments adjust the write scheme (number of pulses, etc.) based on the memory operating conditions, e.g. operating temperature.

The anomalously high write error rate of certain memory elements might be caused by the magnetic state of the bit free layer during the reversal process. For example, the magnetization of the free layer may adopt a non-uniform configuration preventing it from reversing during the current pulse. After the current is turned off, the magnetization of the free layer will relax to its initial state. For a multi pulse write approach to be efficient, the magnetization of the free layer needs to be either in the initial state or switched state when the pulses are applied. Therefore, in one exemplary embodiment, the delay between the write pulses should be long enough to allow the magnetization to relax to its equilibrium state—typically, a few nanoseconds or less.

In another exemplary embodiment, a write pulse pattern with reversed polarity between the write pulses may be used to reduce the minimum delay. The duration of the reversed polarity pulse is typically a few nanoseconds or less. The spin transfer torque induced by the current pulse acts like an anti-damping and causes the free layer magnetization to reverse. Adding a voltage pulse with reversed polarity in between two consecutive write pulses, will act like an enhanced damping and might help the magnetization of the free layer to relax faster to its equilibrium position. Therefore, the delay between the two consecutive write pulses could be reduced, allowing for longer write pulses for a given total write duration. The amplitude of the reversed polarity pulse is chosen low enough so that it will not cause the magnetic bit to be reset to its initial state in case a previous write pulse set it to the desired state.

The optimal write voltage is likely to change depending on the operating conditions of the memory, for example, temperature. Therefore, in another exemplary embodiment, the write pattern, for example, number of pulses, amplitude, or delay could be adjusted based on the operating conditions. While operating at high temperature, the minimum delay might be reduced because of a shorter relaxation time. This would allow for longer write pulses.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

A magnetoresistive random access memory (MRAM) array includes write current drivers and sense-amplifiers positioned near a plurality of magnetoresistive bits. A write, or program, operation begins when a current of either one of the two different and opposite polarities, set or reset, is applied through the magnetic storage element, e.g., MTJ. Such write mechanism is employed in spin-transfer torque (STT) or spin torque (ST) MRAM. The spin-torque effect is known to those skilled in the art. Briefly, a current becomes spin-polarized after the electrons pass through the first magnetic layer in a magnetic/non-magnetic/magnetic tri-layer structure, where the first magnetic layer is substantially more magnetically stable than the second magnetic layer. The higher magnetic stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

Figure 1:
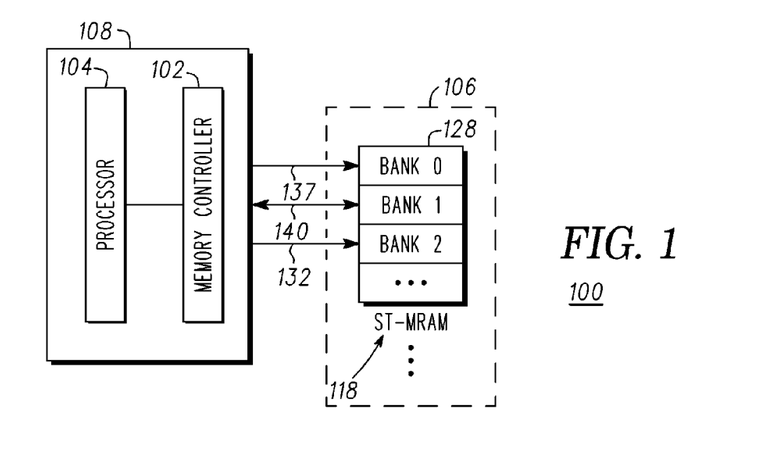
FIG. 1 is a block diagram of a memory interconnection system comprising of a memory controller between a processor and non-volatile memory that may be used to apply the methods in accordance with the exemplary embodiments.

FIG. 1 is a block diagram of an exemplary memory system 100 including a memory controller 102 that performs data transfer between a processor 104 and the memory 106. The invention is not to be limited to this particular type of architecture. The memory controller 102 and the processor 104 may reside on the same chip 108, or they may reside on separate chips (not shown). The memory 106 comprises a non-volatile memory 118 using ST-MRAM magnetic tunnel junctions for data storage. The non-volatile memory 118 comprises a plurality of non-volatile memory banks 128.

A chip select (CS) line 132 provides a CS signal from the memory controller 102 to the non-volatile memory 118. An address bus 137 and a data line 140 couples the memory controller 102 to the non-volatile memory 118. Other control and clock signals may exist between the memory controller 102 and non-volatile memory 118 that are not shown in FIG. 1. Furthermore, an address bus 137 and a data line 140 may include multiple lines or bits.

A conventional write operation consists of a voltage pulse of amplitude Vw and duration t applied to a memory element to set its magnetic state. Each memory element shows a switching probability distribution 205 as a function of write voltage that is theoretically described by an error function with average value Vc and standard deviation $\sigma_{Vc}$, as illustrated by the line 204 FIG. 2. Because of process non-uniformity, the Vc value of each memory element varies element to element, usually according to a normal distribution of standard deviation $\sigma_{Vc}^{ee}$. Vc, $\sigma_{Vc}^{ee}$ and a depend on the MTJ stack and the nanofabrication process. Vc and $\sigma_{Vc}$ also depend on the write pulse duration. The write voltage Vw is chosen high enough to result in a desired write error rate $WER_0$ defined by the memory size and application specifications. The write pulse duration t has an upper limit Tmax usually defined by timing constraints to achieve a desired memory speed. Typically, a write error rate lower than $10^{-8}$ is required for Mb size memories.

Assuming that $\sigma_{Vc}$ and $\sigma_{Vc}^{ee}$ follow a normal distribution and that the physical mechanisms responsible for these distributions are uncorrelated, it is reasonable to choose the write pulse as a single voltage pulse of duration Tmax and amplitude $Vw = \langle Vc \rangle + n\sqrt{\langle \sigma_{Vc} \rangle^2 + \langle \sigma_{Vc}^{ee} \rangle^2}$ where $\langle Vc \rangle$, $\langle \sigma_{Vc} \rangle$, and $\langle \sigma_{Vc}^{ee} \rangle$ are, respectively, the average switching voltage, the average switching voltage standard deviation, and the average element to element switching voltage standard deviation of the memory array. "n" is defined as the inverse standard normal distribution evaluated in 1/N where N is the number of memory elements in the array.

In practice, setting the write conditions is often complicated by a non-ideal behavior of the magnetic memory elements. It is common knowledge that magnetic tunnel junctions often show deviation from the ideal switching distribution especially for short write pulses, typically less than 50 ns. It has also been reported that the magnetic tunnel junctions show deviation from the ideal switching distribution at elevated bias. Because patterning small memory elements, typically less than 100 nm characteristic dimension, is a challenging process, $\langle \sigma_{Vc}^{ee} \rangle$ is significant, typically 4 to 10% of $\langle Vc \rangle$. Therefore, the operating voltage Vw can be significantly higher than $\langle Vc \rangle$ resulting in non-ideal switching distributions.

Figure 2:
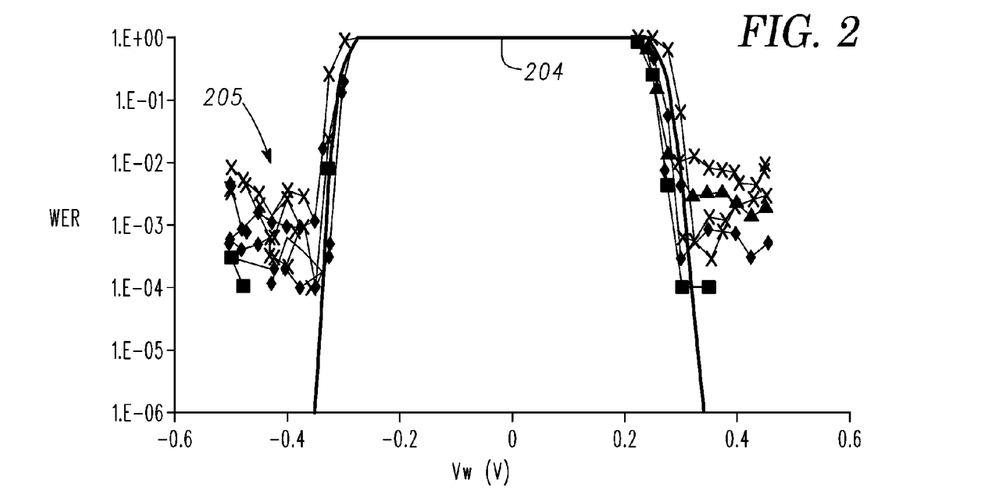
FIG. 2 is a graph of applied voltage versus write error rate for an assembly of bits with anomalous switching distributions having been written with a single voltage pulse.

In the example of FIG. 2, the switching probability 205 of some of the memory elements deviates from the theoretical distribution and plateaus at a relatively high value. It should be noted that the position of this plateau is independent of the write pulse duration (not shown). In this example, it is highly likely that a write error rate of less than $10^{-8}$ could not be achieved at any practical Vw and Tmax.

Figure 3:
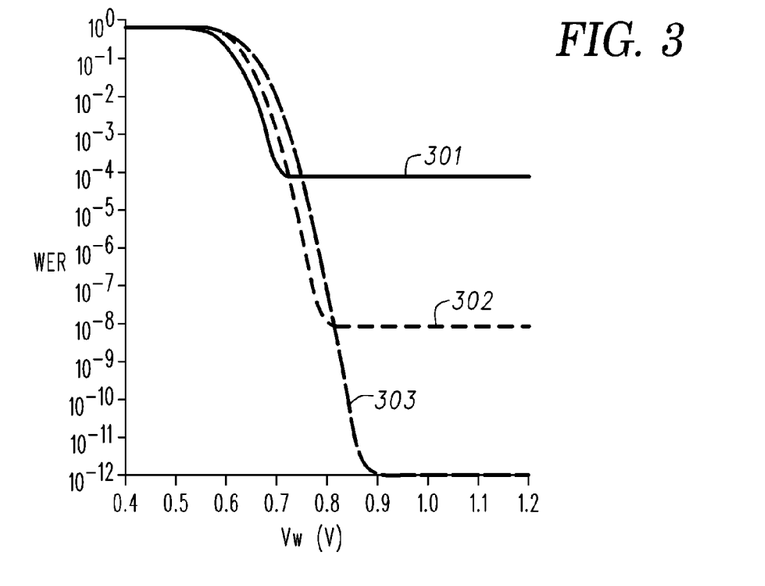
FIG. 3 is a graph of write voltage versus simulated write error rate for single, double, and triple pulses in accordance with the exemplary embodiment.

To address this issue, a write pattern composed of several pulses is described. FIG. 3 shows a theoretical modeling of the switching distribution 301 of a non-ideal bit, as described previously, when subjected to a single write pulse. The write error rate is chosen to plateau at $10^{-4}$ and the write pulse duration is 22 ns. When applying two 10 ns write pulses spaced by 2 ns 302, the plateau is brought down to $10^{-8}$ because of the switching probability multiplication. For three 6 ns pulses spaced by 2 ns 303, the minimum write error rate becomes $10^{-12}$. If the minimum achievable switching probability for a single pulse is P and provided that the delay between consecutive pulses is greater than the magnetization relaxation time, typically on the order of a few ns, the minimum achievable switching probability will scale as $P^n$ for a n-pulse write pattern.

Figure 4:
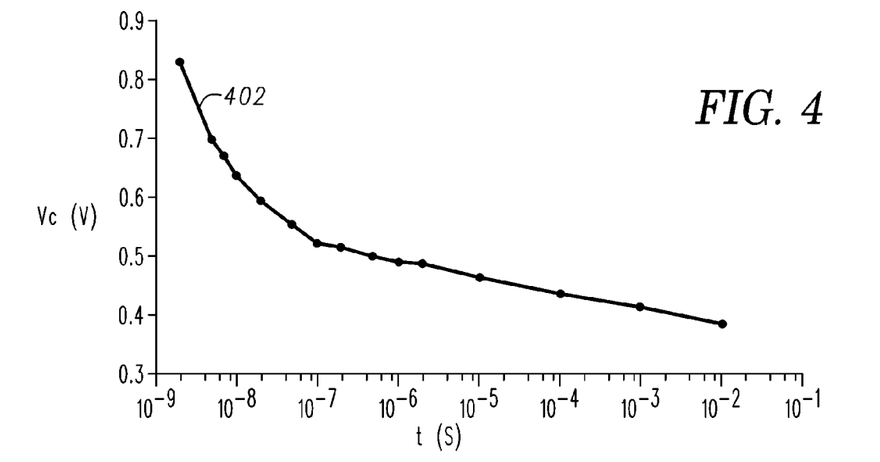
FIG. 4 is a graph of pulse duration versus switching voltage for a single write pulse.

As illustrated by FIG. 4, the switching voltage 402 of a memory element increases as the pulse duration is reduced. Two regimes are commonly identified. For long pulses, usually 100 ns and above, the reversal process is assisted by thermal activation and using n write pulses of T ns (T>100) or a single write pulse of n*T ns leads to the same Vc value. For short pulses, usually 10 ns and less, Vc exhibits a steeper increase with shorter pulses. This regime is referred to as dynamical. In this case, n write pulses of T ns (T<10) lead to a higher Vc than a single write pulse of n*T ns.

Figure 5:
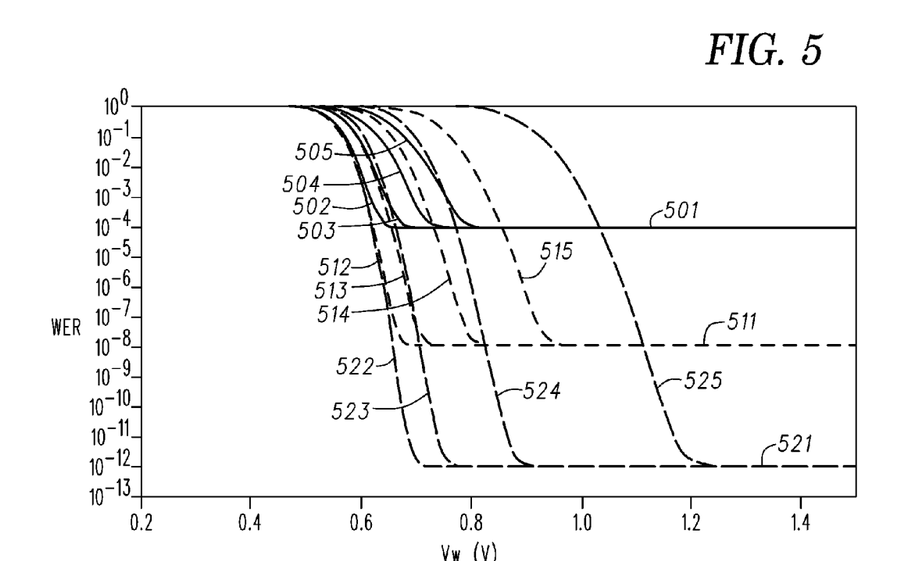
FIG. 5 is a graph of write voltage versus simulated write error rate for single, double, and triple pulses having various durations in accordance with the exemplary embodiment.

The graph of FIG. 5 illustrates modeled values for the switching probability of a memory element with a single 501, double 511, and triple-pulse write 521 for different total write durations, from 100 ns to 10 ns with a 2 ns delay between pulses as follows:

| Numeral | Pulses | Individual pulse duration (ns) |
|---|---|---|
| 505 | 1 | 10.0 |
| 504 | 1 | 20.0 |
| 503 | 1 | 50.0 |
| 502 | 1 | 100.0 |
| 515 | 2 | 4.0 |
| 514 | 2 | 9.0 |
| 513 | 2 | 24.0 |
| 512 | 2 | 49.0 |
| 525 | 3 | 2.0 |
| 524 | 3 | 5.3 |
| 523 | 3 | 15.3 |
| 522 | 3 | 32.0 |

For a more realistic description, a $\langle \sigma_{Vc} \rangle$ dependence on pulse duration was used. In the thermal activation regime, for example 502, 512 and 522, a write pattern composed of several pulses is always beneficial as it provides a lower minimal write error rate and does not constitute a significant increase in Vw. In the dynamical regime, for example 505, 515 and 525, the shorter pulse duration required by the multi-pulse approach leads to a significant increase of Vw which is detrimental to the memory operation as it will reduce its endurance.

Figure 6:
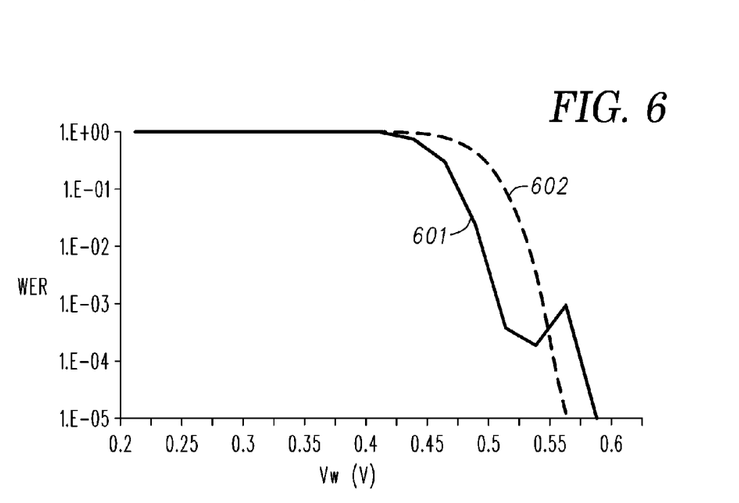
FIG. 6 is a graph of write error rate versus write voltage for one memory element in accordance with the exemplary embodiment.

FIG. 6 compares the write error rate for a magnetic element showing a deviation from the ideal switching distribution with a single 20 ns write pulse 601 and a double 10 ns write pulse 602. The double pulse 602 shows an increase in switching voltage because of the proximity of the dynamical regime, but allows lower write error rate at lower applied voltage compared the single pulse.

The previous discussion has focused on memory elements showing non-ideal switching distributions manifesting as a write error rate plateau at elevated bias. The same approach could be applied to other anomalous behaviors that manifest as a low switching probability due to the magnetization of the free layer of the magnetic element not switching in response to a write voltage pulse.

In an actual memory, the magnetic bits will show a variety of non-ideal switching distributions, for example different levels of write error rate plateau. The bits with a plateau lower than $WER_0$ can be considered as ideal. The total write pulse duration is also likely to be in the vicinity of the dynamical regime, typically less than 50 ns. Therefore, setting the optimal write pulse conditions will result from a tradeoff between the number of pulses i and the operating write voltage Vw. Increasing the number of pulses will improve the write error rate for non-ideal bits and therefore improve the overall memory write error rate. However, it will also raise the write voltage Vw for all the bits.

Vw can be set within a range Vmin to Vmax generally defined by the memory power supplies. Similarly the individual pulse duration, t, can be set within a range Tmin to Tmax. Tmax is the maximum single pulse duration the circuit can allow and still meet its speed requirement. Tmin will mostly likely be limited by the steep increase in switching voltage of the free layer in the dynamical regime, typically on the order of 1 to 10 ns.

Figure 7:
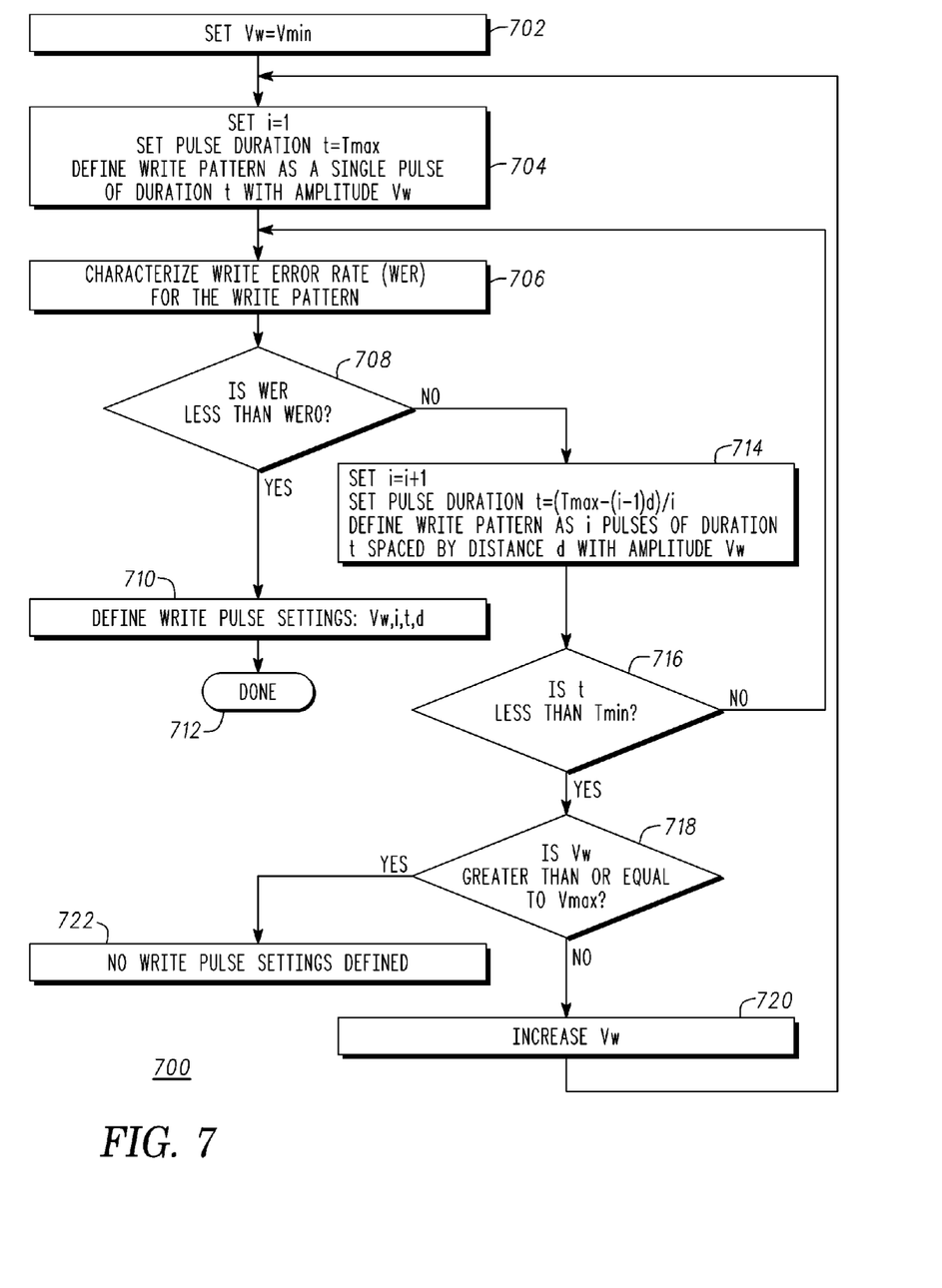
FIG. 7 is a flow chart of the steps for defining the write pulse settings of a spin-torque magnetoresistive random access memory in accordance with an exemplary embodiment.

FIG. 7 describes a procedure to determine optimized write pulse settings for the memory, yielding to fast write speed at low applied voltage for a desired write error rate $WER_0$. A series of i pulses of amplitude Vw of duration t with a delay d is used to write the memory elements. The procedure described in FIG. 7 is to determine the values of i, Vw, t, and d. For illustrative purposes, the following description of process 700 may refer to elements mentioned above in connection with FIG. 1. It should be appreciated that process 700 may include any number of additional or alternative tasks, the tasks shown in FIG. 7 need not be performed in the illustrated order, and process 700 may be incorporated into a more comprehensive procedure or process having additional functionality not described in detail herein. Moreover, one or more of the tasks shown in FIG. 7 could be omitted from an embodiment of the process 700 as long as the intended overall functionality remains intact.

Referring to FIG. 7, the write voltage Vw is set in 702 to equal Vmin. In step 704, the number of pulses i and the pulse duration t are set to equal 1 and Tmax, respectively. The write pattern is defined as a single pulse of duration t with a write voltage amplitude Vw. The write error rate is characterized 706 for the write pattern. If the write error rate is less than a desired write error rate $WER_0$ 708, the write pulse settings are defined 710 for Vw, i, t and d and the process 700 is complete 712.

If the write error rate is greater than the desired write error rate $WER_0$ 708, step 714 sets i to equal i+1, sets the pulse duration t to equal (Tmax−(i−1)d)/i, and defines the write pattern as i pulses of duration t spaced by distance d with amplitude Vw. If t is greater than Tmin 716, the process 700 is repeated from step 706; however, if t is less than Tmin 716, and Vw is less than to Vmax 718, then Vw is increased 720 and the process 700 is repeated from step 704. In step 718, if Vw is greater than or equal to Vmax, the process is halted, unable to define appropriate write pulse settings 722 for the given memory specifications.

In another exemplary embodiment, the process 700 will be repeated for different operating conditions, such as operating temperature. The switching distribution of the memory elements and the relaxation time of the magnetization of the free layer change with temperature and are likely to shift the optimal write pulse settings i, Vw, t, and d. Therefore it might be advantageous to characterize the write pulse settings at different temperatures and adjust the memory settings as the temperature changes during its operation.

Figure 8:
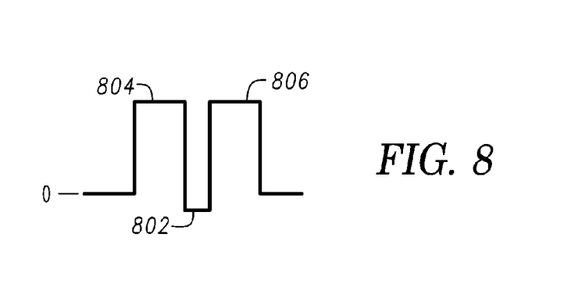

In another exemplary embodiment, illustrated FIG. 8, a write pulse 802 with reversed polarity between the write pulses 804, 806 may be used to reduce the minimum delay. The duration of the reversed polarity pulse is typically a few nanoseconds or less. The spin transfer torque induced by the current pulse 804, 806 acts like an anti-damping and causes the free layer magnetization to reverse. Adding a voltage pulse 802 with reversed polarity between two consecutive write pulses 804, 806, will act like an enhanced damping and might help the magnetization of the free layer to relax faster to its equilibrium position. Therefore, the delay between the two consecutive write pulses could be reduced, allowing for longer write pulses for a given total write duration. The amplitude of the reversed polarity pulse is chosen low enough so that it will not cause the magnetic bit to be reset to its initial state in case a previous write pulse set it to the desired state.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of writing to a magnetoresistive memory cell in a magnetic random access memory, wherein data is stored in a magnetic state of the magnetoresistive memory cell based on a magnetization vector of a free layer relative to a magnetization vector of a fixed layer, the method comprising:
    applying a write pulse pattern to the magnetoresistive memory cell to write data into the magnetoresistive memory cell by setting the magnetic state of the magnetoresistive memory cell, the write pulse pattern consists essentially of:
        a first write pulse having a first amplitude and a first pulse duration;
        a second write pulse having the first amplitude and the first pulse duration; and
        wherein the first write pulse and the second write pulse are consecutive write pulses separated by a delay period without an intervening read operation.

2. The method of claim 1, wherein the delay period between the first write pulse and the second write pulse is sufficient in duration to allow the magnetoresistive memory cell to relax to an equilibrium state.

3. The method of claim 1 further comprises:
    detecting an operating condition of the magnetic random access memory; and
    determining the first pulse duration using the operating condition.

4. The method of claim 1 further comprises:
    detecting an operating condition of the magnetic random access memory; and
    determining duration of the delay period using the operating condition.

5. The method of claim 1 further comprises:
    detecting an operating condition of the magnetic random access memory; and
    determining the first amplitude using the operating condition.

6. The method of claim 1:
    detecting temperature corresponding to the magnetic random access memory; and determining at least one of the first pulse duration, the first amplitude, and the delay period based on the temperature detected.

7. The method of claim 1, further comprises:
detecting at least one operating condition corresponding to the magnetic random access memory;
adjusting the write pulse pattern based on the at least one operating condition to produce an adjusted write pulse pattern, wherein adjusting the write pulse pattern includes adjusting a number of write pulses applied in the adjusted write pulse pattern; and
applying the adjusted write pulse pattern to the memory cell.

8. A method of writing to and reading from a memory cell in a memory, comprising:
writing data into the memory cell by applying a write pulse pattern to the memory cell, wherein the write pulse pattern consists essentially of:
a first write pulse having a first amplitude and a first pulse duration; and
a second write pulse having the first amplitude and the first pulse duration, wherein the first write pulse and the second write pulse are consecutive write pulses separated by a delay period without an intervening read operation; and
after writing data to the memory cell, reading the data from the memory cell, wherein reading the data includes:
detecting a resistance of the memory cell; and
determining the data stored in the memory cell based on the resistance detected.

9. The method of claim 8, wherein the memory is a magnetic random access memory and the delay period is less than 5 nanoseconds.

10. The method of claim 8, wherein the delay period between the first write pulse and the second write pulse is sufficient in duration to allow the memory cell to relax to an equilibrium state.

11. The method of claim 8 further comprising:
detecting at least one operating condition corresponding to the memory;
adjusting the write pulse pattern based on the at least one operating condition to produce an adjusted write pulse pattern; and
applying the adjusted write pulse pattern to the memory cell.

12. The method of claim 11, wherein detecting at least one operating condition further comprises detecting temperature.

13. The method of claim 11, wherein adjusting the write pulse pattern includes adjusting a number of pulses applied in the adjusted write pulse pattern.

14. The method of claim 11, wherein adjusting the write pulse pattern includes adjusting amplitude of the write pulses applied in the adjusted write pulse pattern.

15. The method of claim 11, wherein adjusting the write pulse pattern includes adjusting a delay between write pulses applied in the adjusted write pulse pattern.

16. A method of writing to a magnetoresistive memory cell in a magnetic random access memory, wherein data is stored in a magnetic state of the magnetoresistive memory cell based on a magnetization vector of a free layer relative to a magnetization vector of a fixed layer, the method comprising:
applying a write pulse pattern to the magnetoresistive memory cell in the random access memory to write data into the magnetoresistive memory cell by setting the magnetic state of the magnetoresistive memory cell, the write pulse pattern consists essentially of a plurality of consecutive write pulses, the plurality of consecutive write pulses consisting essentially of write pulses each having a first amplitude and a first pulse duration;
wherein each consecutive write pulse in the plurality of consecutive write pulses is separated from a previous write pulse in the plurality of consecutive write pulses by a first delay period without an intervening read operation.

17. The method of claim 16, wherein the first delay period is sufficient in duration to allow the magnetoresistive memory cell to relax to an equilibrium state between write pulses.

18. The method of claim 16 further comprises:
detecting an operating condition of the magnetic random access memory; and
determining the first pulse duration using the operating condition.

19. The method of claim 16 further comprises:
detecting an operating condition of the magnetic random access memory; and
determining duration of the first delay period using the operating condition.

20. The method of claim 1 further comprises:
detecting an operating condition of the magnetic random access memory; and
determining the first amplitude using the operating condition.

* * * * *